United States Patent
Okamura

(10) Patent No.: US 8,405,278 B2
(45) Date of Patent: Mar. 26, 2013

(54) MULTI-LAYER PIEZOELECTRIC ELEMENT, EJECTION DEVICE HAVING THE ELEMENT, AND FUEL EJECTION SYSTEM

(75) Inventor: Takeshi Okamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 443 days.

(21) Appl. No.: 12/740,102

(22) PCT Filed: Oct. 22, 2008

(86) PCT No.: PCT/JP2008/069092
§ 371 (c)(1),
(2), (4) Date: Jul. 26, 2010

(87) PCT Pub. No.: WO2009/057489
PCT Pub. Date: May 7, 2009

(65) Prior Publication Data
US 2010/0294853 A1 Nov. 25, 2010

(30) Foreign Application Priority Data
Oct. 29, 2007 (JP) .................................. 2007-280308

(51) Int. Cl.
*H01L 41/083* (2006.01)

(52) U.S. Cl. ........................................ 310/328; 310/366

(58) Field of Classification Search .................. 310/328, 310/366
See application file for complete search history.

(56) References Cited

U.S. PATENT DOCUMENTS

| | | | | |
|---|---|---|---|---|
| 5,196,757 | A * | 3/1993 | Omatsu | 310/358 |
| 6,809,459 | B2 * | 10/2004 | Ikeda et al. | 310/323.11 |
| 8,125,124 | B2 * | 2/2012 | Kondo et al. | 310/366 |
| 8,288,921 | B2 * | 10/2012 | Terazono et al. | 310/328 |
| 2006/0238073 | A1 | 10/2006 | Ragossnig et al. | 310/328 |
| 2007/0278907 | A1 | 12/2007 | Kondo et al. | 310/364 |
| 2010/0013359 | A1 * | 1/2010 | Shoji et al. | 310/366 |
| 2010/0288849 | A1 * | 11/2010 | Okamura | 239/102.2 |
| 2010/0320284 | A1 * | 12/2010 | Okamura | 239/102.2 |

FOREIGN PATENT DOCUMENTS

| | | |
|---|---|---|
| JP | 2006-013437 | 1/2006 |
| JP | 2006-518934 | 8/2006 |
| JP | 2007-027692 | 2/2007 |
| JP | 2007-043094 | 2/2007 |

* cited by examiner

*Primary Examiner* — J. San Martin
(74) *Attorney, Agent, or Firm* — DLA Piper LLP (US)

(57) ABSTRACT

Provided is a multi-layer piezoelectric element in which the amount of the positional displacement can be suppressed even when continuous driving is performed for a long time under high electrical field and high pressure, and which may have a good durability. The laminated piezoelectric element comprises a stacked body in which piezoelectric layers and metal layers are stacked alternately one on another. The metal layers comprise internal electrodes and a low-rigidity metal layer which has rigidity lower than those of the piezoelectric layer and the internal electrode. The low-rigidity metal layer comprises a plurality of metal parts isolated from each other via voids, and a covering layer which covers at least a part of the metal parts.

15 Claims, 9 Drawing Sheets

MULTI-LAYER PIEZOELECTRIC ELEMENT, EJECTION DEVICE HAVING THE ELEMENT, AND FUEL EJECTION SYSTEM

CROSS-REFERENCE TO THE RELATED APPLICATIONS

This application is a national stage of international application No. PCT/JP2008/069092, filed on Oct. 22, 2008, and claims the benefit of priority under 35 USC 119 to Japanese Patent Application No. 2007-280308, filed Oct. 29, 2007, the entire contents of which are incorporated herein by reference.

TECHNICAL FIELD

The present invention relates to a multi-layer piezoelectric element, an ejection apparatus and a fuel ejection system, and more particularly to a multi-layer piezoelectric element, for example, a driving element (piezoelectric actuator) mounted in a fuel ejection apparatus of an automobile engine, a liquid ejection apparatus of an ink jet printer or the like, a precision positioning device for an optical apparatus, a vibration prevention device; a sensor element mounted in a combustion pressure sensor, a knocking sensor, an acceleration sensor, a load sensor, an ultrasound sensor, a pressure sensor, a yaw rate sensor or the like; and circuit component mounted in a piezoelectric gyro, a piezoelectric switch, a piezoelectric transducer, a piezoelectric breaker or the like; to an ejection apparatus using the same and a fuel ejection system.

RELATED ART

Conventionally, the multi-layer piezoelectric element becomes smaller and is required to undergo a greater amount of displacement under a higher pressure. Thus, a construction of a multi-layer piezoelectric element, which can be operated continuously over a longer period of time with an electric field of higher intensity applied thereto, is required.

Unlike the usual multi-layer electronic parts, such as a capacitor, the multi-layer piezoelectric element itself causes a continuous dimensional change when it is driven. Accordingly, all piezoelectric layers are tightly bonded via an internal electrode and driven as a whole, thereby the multi-layer piezoelectric element is greatly driven to deform as a unit. Therefore, a large stress is applied to the element.

As one of the means to solve the above-mentioned problem, a multi-layer piezoelectric element, wherein a porous ceramic layer is preliminarily disposed between the piezoelectric layers as a target breach layer (Patent Document 1). In the Patent Document 1, it is attempted to relax a stress which is applied to each of its piezoelectric layers by breaking the multi-layer piezoelectric element at the porous ceramic layer.

[Patent documents 1] National Publication of Translated Version (Kohyo) No. 2006-518934

DISCLOSURE OF THE INVENTION

Problems to be Solved by the Invention

According to the method disclosed by Patent Document 1, a stress applied to the piezoelectric layers may be relaxed to some extent. However, it is required to the multi-layer piezoelectric element that the element is capable to be used under an environment where a further higher voltage is applied. When the above element having the target breach layer is used under such a severe environment, there is a possibility that the breakage (i.e. cracking) arises at the target breach layer and extends to a direction which is beyond the scope of the assumption. It is because the internal electrode has a continuous plate structure larger than the crystalline particles which form the adjacent piezoelectric layers.

In such an element, the crystalline particles, which deform and causes to drive the expansion and contraction thereof during the piezoelectric drive, are constrained within the internal electrode. Therefore, it comes to be difficult for the crystalline particles to deform solely depending on the driving voltage. Accordingly, the crystalline particles remain under stress.

In addition, in the case where a target breach layer is preliminarily formed within the piezoelectric layers, there is a possibility that the crack extends not only in the target breach layer but also among the particles. When the crack extends as in the latter case, breakage may cause within the crystalline particles and among the crystalline particles, and then the crack may reach the internal electrode, thereby electric short could cause between the internal electrodes having different polarity.

In particular, when the piezoelectric element is driven under the condition having a high voltage and a high electric field, a significant stress is temporarily applied to the piezoelectric element. Thus, it is difficult to stabilize the extending direction of the cracking. On the other hand, a piezoelectric element, which makes it possible to be driven for further longer period of time under the condition having a high voltage and a high electric field, is demanded. Thus, it is necessitated to make the stress applied to the element relaxed more effectively.

The present invention has been devised to solve the above problems. The present invention has a purpose to provide a multi-layer piezoelectric element, which has an excellent durability and has a stabilized amount of displacement when it is driven for a long period of time under a condition having a high voltage and a high electric field, and a fuel ejection apparatus using the same and a fuel ejection system.

Means for Solving the Problems

In order to attain the above purpose, the multi-layer piezoelectric element of the present invention comprises a stacked body in which a plurality of piezoelectric layers and a plurality of metal layers are stacked alternately one on another, wherein the plurality of metal layers comprise internal electrodes and a low-rigidity metal layer which has a rigidity lower than those of the piezoelectric layer and the internal electrode, and wherein the low-rigidity metal layer comprises a plurality of metal parts, which are isolated from each other via voids, and a covering layer which covers at least a part of the metal parts.

The fuel ejection apparatus of the present invention comprises the multi-layer piezoelectric element of one of the above and an ejection hole, wherein liquid is injected through the ejection hole by the drive of the multi-layer piezoelectric element.

The fuel ejection system of the present invention comprises a common rail for storing a high-pressure fuel, an ejection apparatus described above for discharging the fuel stored in the common rail and an ejection control system that issues a drive signal to the ejection apparatus.

Advantage

According to the multi-layer piezoelectric element of the present invention, the low-rigidity metal layer comprises a plurality of metal parts, which are isolated from each other via a void, so that it can have a high durability. It is because the metal parts are isolated from each other via a void, the low-rigidity metal layer becomes easy to deform and the stress is dispersed, thereby the stress can be suppressed from concentrating at a local portion of the multi-layer piezoelectric element.

Furthermore, since at least a part of the metal part is covered by the covering layer, the multi-layer piezoelectric element of the present invention can maintain the outstanding durability for a long period of time. It is because the metal part is covered by the covering layer, thereby the surface area which contacts with the ambient atmosphere, such as the external air, can be made small, so that the denaturation of the metal part can be suppressed.

Figure 1:
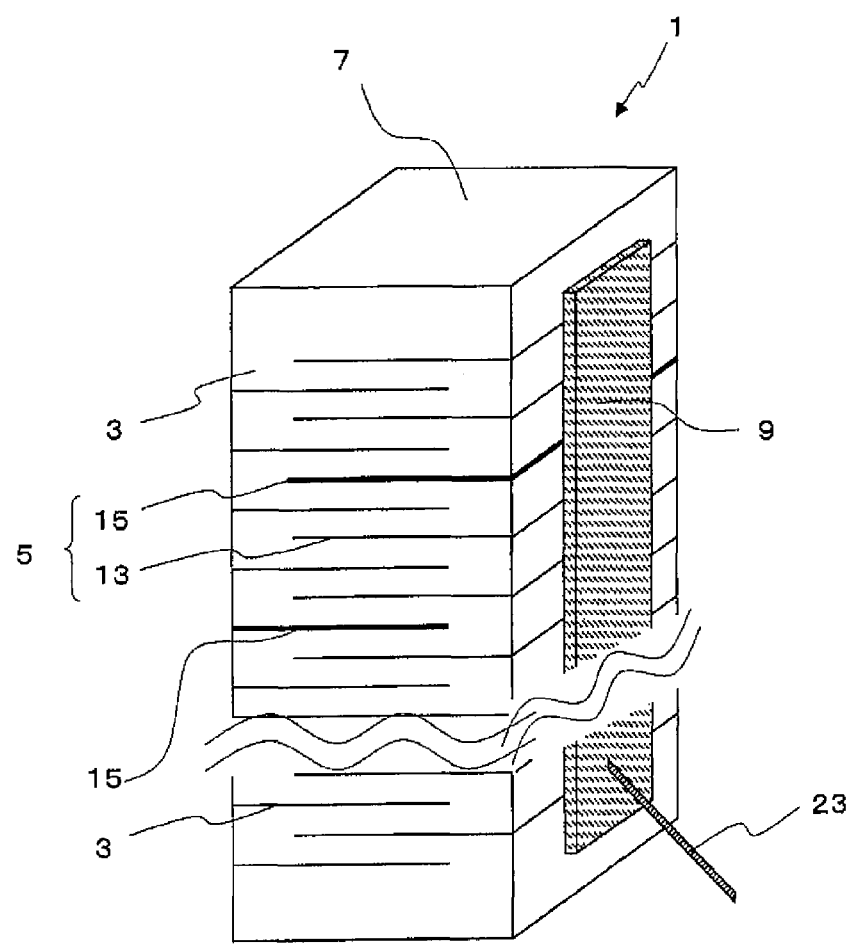
FIG. 1 is a perspective view showing an example of the embodiment of the multi-layer piezoelectric element of the present invention.

| BRIEF DESCRIPTION OF REFERENCE NUMERALS | |
|---|---|
| 1 | Multi-layer piezoelectric element, |
| 3 | piezoelectric layer, |
| 5 | metal layer, |
| 7 | stacked body, |
| 9 | external electrode, |
| 11 | piezoelectric crystalline particles, |
| 13 | internal electrode, |
| 15 | low-rigidity metal layer, |
| 17 | void, |
| 19 | metal part, |
| 21 | covering layer, |
| 21 a | first covering layer, |
| 21 b | second covering layer, |
| 23 | current-carrying part, |

| -continued | |
|---|---|
| BRIEF DESCRIPTION OF REFERENCE NUMERALS | |
| 25 | fuel ejection apparatus, |
| 29 | container, |
| 31 | needle valve, |
| 33 | fuel path, |
| 35 | cylinder, |
| 37 | piston, |
| 39 | plate spring, |
| 41 | fuel ejection system, |
| 43 | common rail, |
| 45 | pressure pump, |
| 47 | ejection control unit, |
| 49 | fuel tank. |

DETAILED DESCRIPTION OF THE PREFERRED EMBODIMENTS

Figure 2:
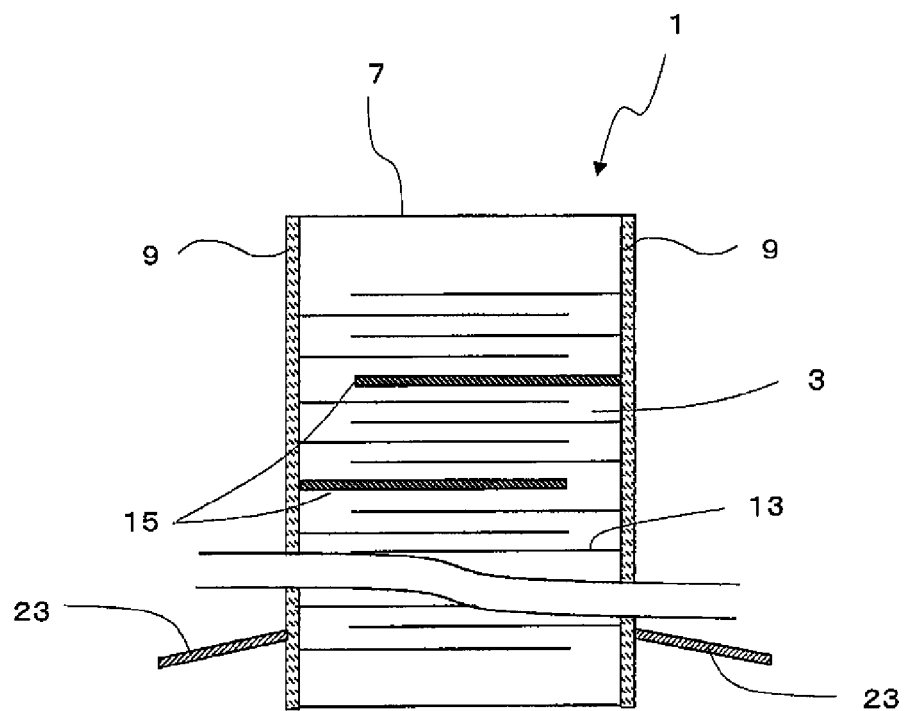
FIG. 2 is an example of the embodiment of the multi-layer piezoelectric element of the present invention, and shows a sectional view parallel to a laminating direction.
Figure 3:
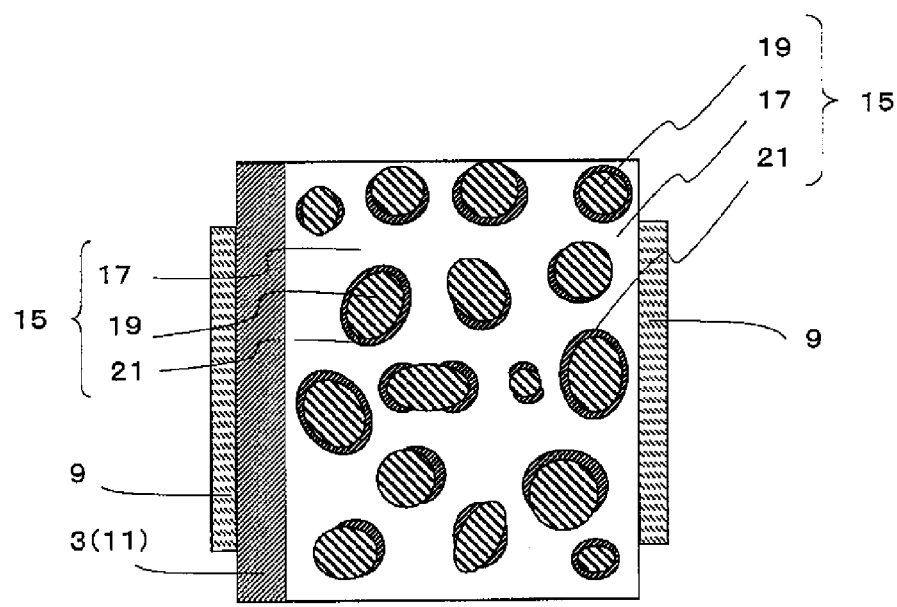
FIG. 3 is an example of the embodiment of the multi-layer piezoelectric element of the present invention, and shows a sectional view perpendicular to a laminating direction, which contains the low-rigidity metal layer 15.

Hereinafter, the multi-layer piezoelectric element of the present invention will be described in detail with reference to the accompanying drawings. FIG. 1 is a perspective view showing an example of the embodiment of the multi-layer piezoelectric element of the present invention. FIG. 2 is an example of the embodiment of the multi-layer piezoelectric element of the present invention, and shows a sectional view parallel to a laminating direction. FIG. 3 is an example of the embodiment of the multi-layer piezoelectric element of the present invention, and shows a sectional view perpendicular to a laminating direction, which contains the low-rigidity metal layer 15.

As shown in FIGS. 1-3, the multi-layer piezoelectric element 1 of the present embodiment (hereinafter, also merely referred to as "element 1") comprises a stacked body 7, which is formed by stacking a plurality of piezoelectric layers 3 and a plurality of metal layers 5 alternately one on another, and external electrodes 9 formed on the side surfaces of the stacked body 7. Each of the piezoelectric layers 3 comprises a plurality of piezoelectric crystalline particles 11, and each of the plurality of metal layers 5 comprises an internal electrode 13, which is connected to the exterior electrode 9, and a low-rigidity metal layer 15, which has rigidity lower than rigidities of the piezoelectric layer 3 and the internal electrode 13.

In this embodiment, the low-rigidity metal layer 15 is a layer having a bonding strength within the layer and/or the adjacent layers weaker than that of the piezoelectric layer 3 and the internal electrode 13 and having a low rigidity. In addition, the low-rigidity metal layer 15 comprises a plurality of metal parts 19, which are located apart from each other via voids 17, and a covering layer 21, which covers at least a part of the side surface of the metal part 21.

Since the plurality of metal parts 19 in the low-rigidity metal layer 15 is located apart from each other via voids 17, they are easily deformable. Thus, in the case where a stress is caused by the expansion and contraction of the element 1 itself in use of the piezoelectric element 1 or a stress or a strong impact is applied to the piezoelectric element 1 from the outside, such an stress would be absorbed by the deformation of the metal parts 19. In this way, it is capable to suppress the crack from causing in the piezoelectric layer 3 and the internal electrode 13 and suppress the electric short circuit from occurring within the internal electrodes 13 which are adjacently stacked in the stacking direction.

Each rigidity of the low-rigidity metal layer 15, the piezoelectric layer 3 and the internal electrode 13 can be easily compared by, for example, applying load to the element in the direction perpendicular to the stacked direction. Specifically, it may be determined by applying load to the element in the direction perpendicular to the stacked direction according to the JIS three-point bending test (JIS R 1601). When the test is performed, it is confirmed which part in the element 1 breaks. The broken part is the part having the lowest rigidity in the element.

Since the multi-layer piezoelectric element 1 of the present embodiment comprises the low-rigidity metal layer 15, the break preferentially occurs in the low-rigidity metal layer 15 or at the interfaces between the low-rigidity metal layer 15 and the piezoelectric layer 3 rather than in the piezoelectric layer 3 and the internal electrode 13 after the JIS three-point bending test was performed. Thus, the evaluation can be performed by the result whether the break occurred in the piezoelectric layer 3, in the internal electrode 13, in the low-rigidity metal layer 15 or at the interfaces between the low-rigidity metal layer 15 and the piezoelectric layer 3.

In addition, it is sufficient to confirm at which part the break occurred in the test. Thus, when the above JIS three-point bending test cannot be applied due to a test specimen size being too small, the evaluation can be performed by preparing a test specimen having a rectangular column form from the element, placing the test specimen on two supporting points located apart at a predetermined distance and applying load to a midpoint between the two supporting points.

In addition, the phrase "having low rigidity" may be interpreted by the phrase "having low Young's modulus". The Young's modulus can be determined, for example, by the nanoindentation method. For example, "Nanoindenter II" (available from Nano Insturment Inc.) can be used as the measuring apparatus. In a cross section perpendicular to or parallel to the stacked direction of the stacked body, the low-rigidity metal layer 15, the piezoelectric layer 3 or the internal electrode 13 is exposed and Young's modulus may be measured using the above measuring apparatus.

Figure 4:
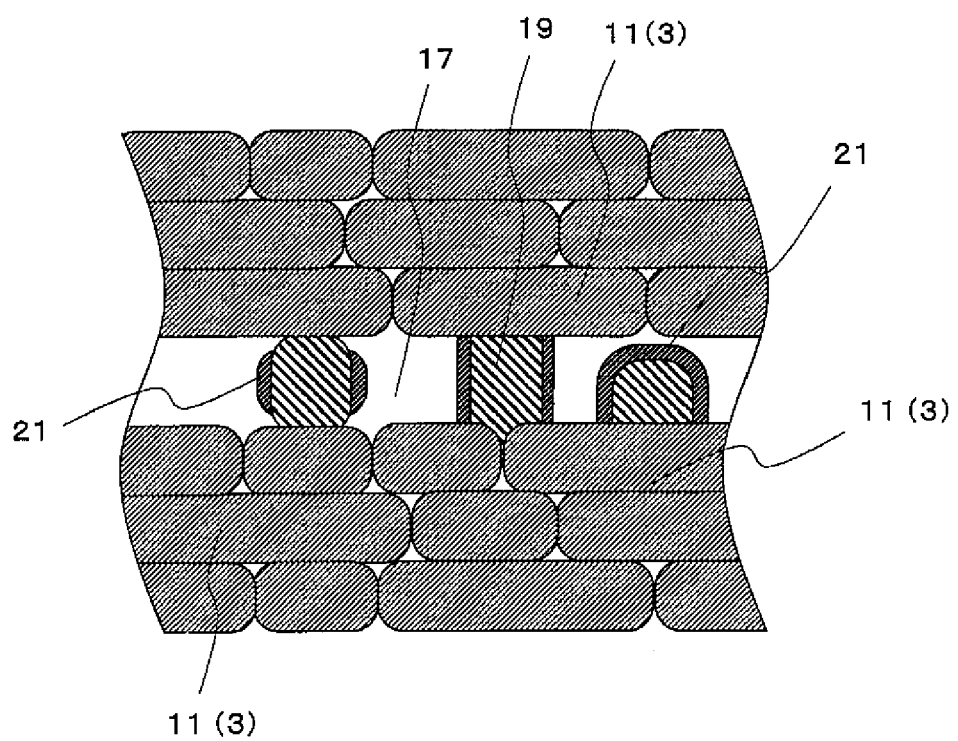
FIG. 4 is an expanded sectional view which expanded the portion A concerning the embodiment shown in FIG. 2.

FIG. 4 shows a partial cross sectional view of the multi-layer piezoelectric element of the embodiment shown in FIG. 2. As shown in FIG. 4, in the multi-layer piezoelectric element 1 of the present embodiment, at least a part of side surface of the metal part 19 is covered by the covering layer 21. Thus, since at least a part of side surface of the metal part 19 is covered by the covering layer 21, the portion of the metal part 19 which contacts with the ambient atmosphere, such as the external air, can be made small. Accordingly, the denaturation of the metal part 19 can be suppressed.

When a strong stress is temporarily applied to the element, stress can be dissipated by peeling the covering layer 21 from the metal part 19. Specifically, when the above-mentioned strong stress is applied to the multi-layer piezoelectric element 1, the metal part 19 is deformed, and then the covering layer 21 deforms. Then, the deformation caused in the above-mentioned metal part 19 and in the covering layer 21 generates heat locally at the bonded interface therebetween, so that the covering layer 21 peels from the metal part 19. Thus, local heat generation makes it possible to scatter the stress with the help of the dissipation of heat. In addition, peeling of the covering layer 21 from the metal part 19 results in the stress scattering, so that it helps to suppress the stress from transferring to the inside of the element. Thereby, crack occurring in the internal electrode 13 or the piezoelectric layer 3 may be suppressed. As a result, it is possible to suppress an electric short circuit from occurring between the internal electrodes 13 which are adjacently stacked in the stacking direction.

In the meanwhile, the side surface of the metal part 19 means the part, which is isolated from the piezoelectric layers 3 in an interspace between the adjacent piezoelectric layers 3, among the surfaces of the metal part 19.

As mentioned above, in the present embodiment, the metal part 19 is covered by the covering layer 21 in the low-rigidity metal layer 15, so that the stress caused inside of the multi-layer piezoelectric element 1 is scattered, and is thereby relaxed. In this embodiment, there are various forms in the desirable forms of the covering layer 21 which covers the metal part 19 depending on the environment where the multi-layer piezoelectric element 1 is used.

For example, when the multi-layer piezoelectric element is used in a condition which includes both of ordinary temperature and elevated temperature, it is preferred that at least a part of side surface of the metal parts 19 is exposed as shown in FIG. 4, at the left one thereof. Thus, when at least a part of side surface of the metal parts 19 is exposed, the durability of the multi-layer piezoelectric element can be improved even when the multi-layer piezoelectric element would be used in a condition which includes both of ordinary temperature and elevated temperature. In the case where the multi-layer piezoelectric element is used for the fuel ejection apparatus of an automobile engine and so forth, the element is used in a condition where an elevated temperature is applied. Thus, the multi-layer piezoelectric element thermally expands to a large extent as compared with the use in a condition at an ordinary temperature. Under such an environment, stress occurs between the metal part 19 and the covering layer 21 due to the difference of the thermal expansion coefficient of the metal part 19 and the covering layer 21.

However, since the whole side surface of the metal part 19 is not covered by the covering layer 21, but at least a part of side surface of the metal part 19 is exposed, the stress can be released through the exposed portion. Thus, it is capable to suppress the stress from occurring in the metal part 19 or the covering layer 21, so that the durability of the multi-layer piezoelectric element can be improved. When the multi-layer piezoelectric element is used in a condition at an elevated temperature, the above form comes to be especially effective.

Figure 5A:
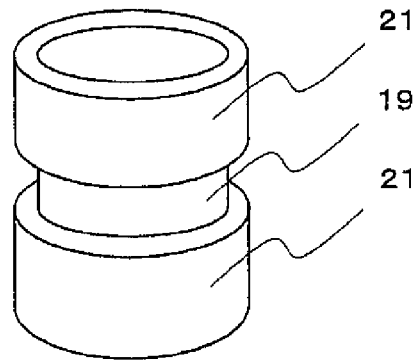
FIG. 5A is a perspective view showing the metal part 19 in other examples of the embodiment of the multi-layer piezoelectric element of the present invention.
Figure 5B:
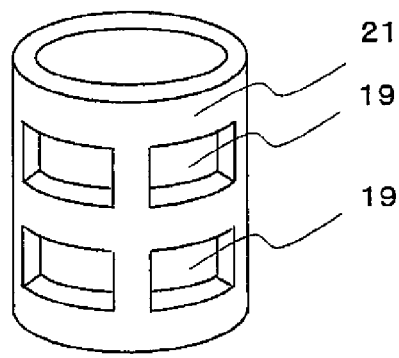
FIG. 5B is a perspective view showing the metal part 19 in other examples of the embodiment of the multi-layer piezoelectric element of the present invention.

In the form where at least a part of side surface of the metal part 19 has exposed, following various forms can be adopted. Each of FIGS. 5A and 5B shows a perspective view of the metal part 19 in the other examples of the present embodiment relating to the multi-layer piezoelectric element of the present invention, respectively. As shown in FIG. 5A, the metal part 19 may have a form in which the side surface thereof is covered by a plurality of covering layers 21, each of which is isolated from each other. In this embodiment, the portion of the side surface of the metal part 19, which exposes between the covering layers 21 isolated from each other, can easily deform, so that the metal part 19 selectively deforms at this portion. As a result, the effect of stress relaxation on the multi-layer piezoelectric element 1 according to the metal part 19 can be highly maintained.

In the case where the stress concentrates locally on a part of the side surface of the metal part 19, thereby the covering layer 21 at the corresponding part peels from the metal part 19, the covering layers 21 which peels from the metal part 19 can be limited to those merely cover the portions where the stress concentrated among the plurality of covering layers 21. Therefore, it is capable to suppress the covering layer 21 as a whole from peeling from the metal part 19. As a result, the metal part 19 can be stably covered by the covering layer 21.

Alternatively, for example, the covering layer 21 may have a form that the covering layer 21 is formed as one member being connected together and the metal part 19 has the side surface having a plurality of exposed regions which are isolated from each other. As shown in FIG. 5B, the side surface of the metal part 19 is covered by the covering layer 21 having the plurality of exposed regions which are isolated from each other, thereby the covering layer 21 can easily deform. Therefore, in the case where the element 1 is driven by applying a voltage, the covering layer 21 can easily follow the expansion and contraction of the metal part 19. As a result, the bonding property between the metal part 19 and the covering layer 21 can be improved. Specifically, it is desirable that the covering layer 21 is formed a mesh shape, since it becomes easy to follow the expansion and contraction of the metal part 19.

Figure 5C:
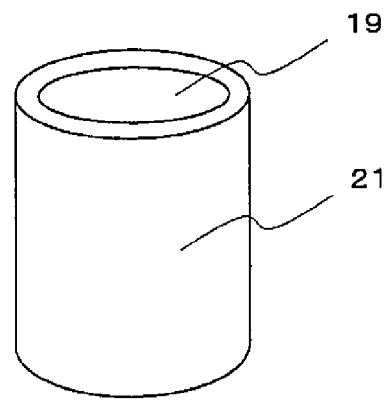
FIG. 5C is a perspective view showing the metal part 19 in other examples of the embodiment of the multi-layer piezoelectric element of the present invention.

In the case where the multi-layer piezoelectric element is used under the atmosphere in which the metal part 19 tends to easily deteriorate, it is preferable that the whole side surface of the metal part 19 is covered by the covering layer 21. It is because when the whole side surface of the metal part 19 is covered by the covering layer 21 as shown in FIG. 5C, exposure of the metal part 19 can be suppressed. Thereby, the side surface of the metal part 19 can be suppressed from being contacted with the ambient atmosphere, and the degradation of the metal part 19 can be more surely suppressed. Particularly in the case where the multi-layer piezoelectric element is used in a condition having an atmosphere which easily degrades the metal portion 19, for example, where the ambient atmosphere contains so much moisture, the above-mentioned embodiment becomes effective.

It is preferable that at least a part of the covering layer 21 is bonded to the piezoelectric layer 3. In the case where the covering layer 21 is bonded with the piezoelectric layer 3, the stress applied to the metal part 19 from the piezoelectric layer 3 accompanied by the driving of the multi-layer piezoelectric element 1 can be scattered from the piezoelectric layer 3 to the covering layer 21. As a result, the durability of the metal part 19 can be improved. In addition, the bonding property between the metal part 19 and the piezoelectric layer 3 can be improved since the covering layer 21 is bonded to the piezoelectric layer 3.

Figure 6:
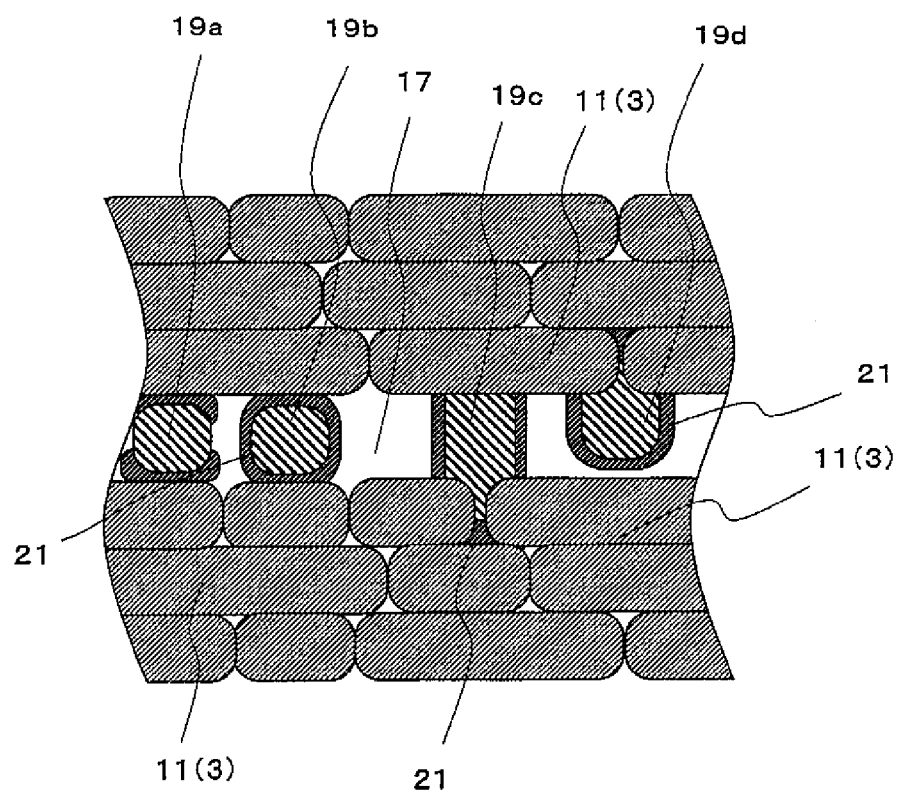
FIG. 6 is an expanded sectional view which expanded the portion in which the low-rigidity metal layer 15 is formed in another example of the embodiment of the multi-layer piezoelectric element of the present invention.

FIG. 6 shows an expanded cross sectional view which shows the portion in which the low-rigidity metal layer 15 is located, in the other examples of the present embodiment relating to the multi-layer piezoelectric element of the present invention. As shown in FIG. 6, there are various forms in the forms of the metal part 19 and the covering layer 21 which covers the metal part. For example, in the case where the multi-layer piezoelectric element is used under the environment in which relatively large stress would be applied to the multi-layer piezoelectric element 1, it is preferable that at least one of the plurality of the metal parts 19 is isolated from the piezoelectric layer 3 and is bonded to the piezoelectric layer 3 via the covering layer 21 as shown FIG. 6, by indicating with the reference numerals of 19a and 19b. Even if a strong stress is locally applied to the interface between the low-rigidity metal layer 15 and the piezoelectric layer 3, the influence can be kept to damage the covering layer 21, and damaging to the metal parts 19 and the piezoelectric layer 3 can be suppressed. As a result, an effect of the stress relaxation due to the metal part 19 can be obtained, and the decrease in the displacement of the multi-layer piezoelectric element 1 may be suppressed.

In the case where the multi-layer piezoelectric element is used in a corrosion-prone environment, it is more preferable that the whole surface of the metal part 19 is covered by the covering layer 21 as shown in FIG. 6, indicating by reference numeral 19b. Since the whole surface of the metal part 19 is covered by the covering layer 21, it is capable to suppress not only the side surface of the metal part 19, but also the surface other than the side surface of the metal part 19 from being contacted with the ambient atmosphere, even when the metal part 19 is isolated from the piezoelectric layer 3. In the case where the surface other than the side surface of the metal part 19 contacts with the ambient atmosphere, such as in the case where the piezoelectric layer 3 is constituted by the piezoelectric crystalline particles 11, the above-mentioned form comes to be effective especially. Thereby, degradation of the metal part 19 can be suppressed more surely.

In addition, as shown in FIG. 6, indicating by reference numeral 19c and 19d, it is capable to enhance the effect of dissipation of the heat, which the piezoelectric crystalline particles 11 self-generated by itself associated with the deformation due to the stress, from the piezoelectric crystalline particles 11 toward the metal part 19 by intruding an end of the metal part 19 into clearance gaps among the piezoelectric crystalline particles 11. Also in such a construction, when the multi-layer piezoelectric element is used in a corrosion-prone environment, the whole surface of the metal part 19 except for the portion which is in contact with the piezoelectric layer 3 may be covered by the covering layer 21 as shown in FIG. 6, indicating by reference numerals 19c and 19d. By adopting the above construction, it is also capable to suppress the side surface of the metal part 19 from being contacted with the ambient atmosphere, such as the external air. Further, the covering layer 21 is capable to protect the metal part 19 from the corrosive halogen ion, such as chlorine gas and so forth, which diffuses into and through the grain boundary among the piezoelectric crystalline particles 11 by intruding the covering layer 21 into among the piezoelectric crystalline particles 11, even when the multi-layer piezoelectric element 1 is used in a corrosive atmosphere containing a halogen gas, such as chlorine, in which atmosphere metals are easily corroded.

In the meanwhile, the metal part 19 contains a metal as its main component in the above embodiment. The metal part 19 may consist of the metallic components solely or may contain the other components such as ceramics and glass. The metallic components specifically include silver, palladium and so forth.

The covering layer 21 may have a material which can suppress the metal part 19 from degrading due to the atmosphere including the operating environment and the external air. Specifically, such a material may include a resin, a glass (i.e. glass), lead, and silver compound such as AgS. When a resin is used for the covering layer, a driving distance of the multi-layer piezoelectric element can be increased, since such a covering layer can follow the expansion and contraction speed of the multi-layer piezoelectric element when it is driven at a high speed due to having an excellent property in expansion and contraction. In addition, when a glass or AgS is used for the covering layer, such covering layer can stably suppress the deformation of the metal part 19 due to having good bonding property with the metal part 19 and the piezoelectric layer 3.

Particularly, it is preferable that the covering layer 21 contains a glass component (glass) as the main component. Since a glass component (glass) has a good bonding property with the metal part 19, the bonding property between the metal part 19 and the covering layer 21 can be improved by using a material containing the glass as its main component for the covering layer 21. In the case where the covering layer 21 is bonded to the piezoelectric layer 3 as shown above, the glass can also improve the bonding property between the piezoelectric layer 3 and the covering layer 21, since the glass has an excellent bonding property with the piezoelectric layer 3. Here, the term main component means that it is the component that has the largest value in % by mass unit among the contained components. In order to analyze an amorphous state, which is peculiar to glass, an X diffraction (XRD) or a transmission electron microscope (TEM) can be used.

It is further preferable that the glass includes a silicon oxide as the main component thereof. It is not only because the silicon oxide forms a liquid phase with the main component of the metal part 19 in the course of forming a multi-layer piezoelectric element by calcination, thereby advancing the calcination, but also because a compatibility with the metal part 19 can be improved. Thereby, the bonding property between the metal part 19 and the covering layer 21 can be further improved.

It is also preferable that the covering layer 21 contains the same component as that of the main component of the metal part 19. Since the covering layer 21 contains the same component as that of the main component of the metal part 19, the main component of the metal part 19 contained in the covering layer 21 bonds with the metal part 19, so that an anchor effect can be acquired. Thereby, the bonding property between the metal part 19 and the covering layer 21 can be further improved.

It is still more preferable that the covering layer 21 contains the oxide compound of the main component of the metal part 19. Since the covering layer 21 contains the oxide compound of the main component of the metal part 19, the metal part 19 bonds to the covering layer 21 by an ionic bonding, which has larger bonding strength than a metallic bonding, thereby the bonding property of the covering layer 21 with the metal part 19 can be further improved.

When the metal part 19 includes silver as its main component, it is effective to use silver compounds including AgS for the covering layer 21. Since each of the metal part 19 and the covering layer 21 includes silver as the main component thereof, the bonding property of the covering layer 21 and the metal part 19 can be improved.

Figure 7:
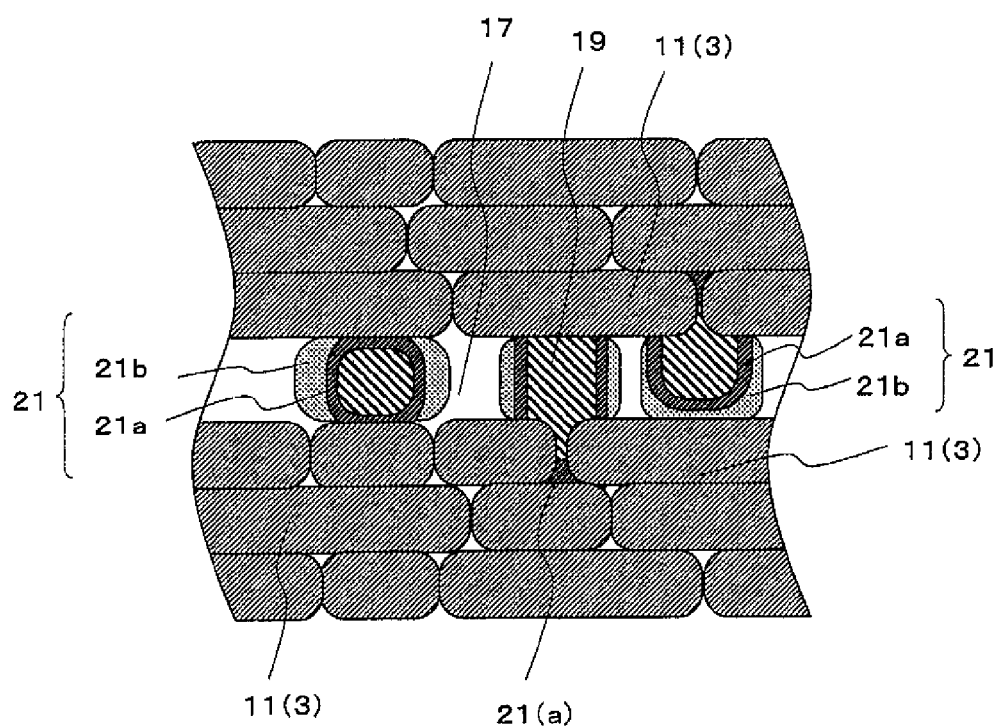
FIG. 7 is an expanded sectional view which expanded the portion in which the low-rigidity metal layer 15 is formed in another example of the embodiment of the multi-layer piezoelectric element of the present invention.

It is preferable that the covering layer 21 comprises a plurality of laminated layers as shown in FIG. 7. In the case where a crack occurs in any one of the layers of the laminated layers, the crack can be remained only in the above-mentioned layers, since the covering layers 21 comprises a plurality of laminated layers. Therefore, extension of the crack is terminated within the plurality of the covering layers 21, thereby extension of the crack toward the other layers can be suppressed. Thereby, it can be suppressed that the covering layer 21 as a whole is influenced by the cracking. Specifically, a material selected from the above-mentioned glass, lead, AgS and so forth may be used as the inside covering layer 21 and a material selected from gold and a resin can be used as the outside covering layer 21.

It is more preferable that the covering layer 21 furthermore comprises a plurality of layers from which the content of the main component of the metal part 19 differs. When the covering layer 21 contains the main component of the metal part 19, the thermal expansion coefficient of the covering layer 21 can be brought close to that of the metal part 19. When the covering layer 21 comprises a plurality of layers as mentioned above, the thermal expansion coefficient in the covering layer 21 can be gradually brought close to the thermal expansion coefficient of the metal part 19. Therefore, the stress produced according to the difference of the thermal expansions between the covering layer 21 and the metal part 19 can be relaxed.

It is preferable that the covering layer 21 comprises a plurality of layers each having a modulus of elasticity different from each other. In the case where the covering layer 21 comprises a plurality of layers each having a modulus of elasticity different from each other, the modulus of elasticity in the covering layer 21 can be gradually brought close to the modulus of elasticity of the metal part 19. Therefore, the stress produced according to expansion and contraction between the covering layer 21 and the metal part 19 can be relaxed. As a result, the peeling of the covering layer 21 from the metal part 19 can be suppressed, and generating of the crack in the metal part 19 or the covering layer 21 can be inhibited.

Particularly, it is preferable that a covering layer material including a glass, such as silica is used as the covering layer 21 that contacts with the metal part 19, and the covering layer 21 comprising a resin is formed thereon. It is because the covering layer 21 can have an excellent expansion and contraction performance peculiar to resin together with an outstanding adhesion property peculiar to glass. In the case where a crack occurs from inside of the covering layer 21, which comprise a glass and contacts with the metal part 19 of the covering layer 21, the crack can be remained only in the inside of the covering layer 21 comprising a glass, so that extension of the crack toward the outside covering layer comprising a resin can be suppressed.

Next, the method for manufacturing the multi-layer piezoelectric element in the present embodiment will be explained.

First, a ceramic green sheet to be the piezoelectric layer 3 is produced. Specifically, a calcined powder of the piezoelectric ceramic, a binder comprising an organic polymer based on an acrylic system or a butyral system and a plasticizer are mixed to form a slurry. Then, the slurry is subjected to a known tape molding methods including such as a doctor blade method or a calender roll method, thereby a ceramic green sheet is produced. As a piezoelectric ceramic, a material having the piezoelectric property, for example, a perovskite oxide such as $PbZrO_3$—$PbTiO_3$ may be used. As the plasticizer, DBP (dibutyl phthalate), DOP (dioctyl phthalate) and so forth can be used.

Then, an electrically conductive paste for forming the metal layer 5 is produced. Specifically, the electrically conductive paste is produced by adding and mixing a binder and a plasticizer and so forth to a metal powder comprising such as silver-palladium. This electrically conductive paste is placed over a whole surface region by screen printing method and calcined as mentioned infra, thereby an internal electrode is produced.

The internal electrode 13 can be produced by calcining the above-mentioned electrically conductive paste. In order to produce the low-rigidity metal layer 15 which has a plurality of metal parts 19 located apart from each other via voids 17, an electrically conductive paste, to which the above-mentioned scattering component was added in an excess amount compared with the content thereof in the electrically conductive paste for producing the internal electrode 13 is placed over a whole surface region of a ceramic green sheet by the screen printing method. Thereafter, the ceramic green sheet is subjected to a calcination process or a degrease process, through which process the scattering component added in an excess amount scatters, so that a plurality of the metal parts 19, which are located apart from each other via voids 17 can be produced.

The method of forming the metal part 19, which are located apart from each other via voids 17, is not restricted to the above-mentioned method. For example, the above-mentioned metal part 19 can be also formed by changing the aperture size or the pattern of a mesh of a screen. Specifically, when the mesh size of the screen is selected to be 15 μm or less, thereby passing of the amount of ink paste becomes insufficient, which leads to a condition of so-called blur pattern. Thus, the metal part 19, which are located apart from each other via voids 17 can be produced.

When a masking which does not allow the ink paste to pass through the screen is adopted, the condition where the ink paste insufficiently passes through is resulted as similar to the above. Therefore, the metal part 19, which are located apart from each other via voids 17, can be produced. The shape of the masking is preferable to have almost circular shape, such as an ellipse or a circle, since such a shape has an improved effect to relax the stress.

As a method of forming the covering layer 21, which covers at least a part of the side surface of the metal part 19, the following method can be mentioned:

First, a method of laminating a ceramic green sheet and a conductive paste to form a laminate, calcining the laminate, and immersing the laminate within a solution having the components of the covering layer 21 may be mentioned. Thus, the metal part 19 surface can be covered by the covering layer 21 by immersing the laminate in the solution having the components of the covering layer 21, thereafter pulling it up. At this time, after the laminate is immersed in a container, the gases such as air existing within the voids 17 in the low-rigidity metal layer can be discharged by degassing the container with using a vacuum pump such as a rotary pump. Thus, the components of the covering layer 21 can be prevailed. Thereafter, the pressure is returned to an atmospheric pressure from a vacuum, the element is heated, thereby merely the solvent is evaporated from the solution, so that the covering layer 21 having voids 17 therein can be obtained.

As the solution for the components of the covering layer 21, an aqueous dispersion (solution) in which tetra-ethoxy silane (TEOS) or colloidal silica is dispersed in water can be used. In this case, the covering layer 21 can form the covering layer 21 made of a glass, which mainly contains an oxide of silicon (Si). Alternatively, the covering layer 21 comprising a resin can be produced by using a solution which was made by diluting a resin of an epoxy system or a silicone system with a solvent selected from acetone, ether, chloroform or thinner for industrial use and so forth.

Second, it may be mentioned that the method of incorporating a member for forming the covering layer 21 into the electrically conductive paste to form the low-rigidity metal layer 15, thereafter depositing by the above calcination. In particular, when the process of producing the covering layer 21 by depositing the components to form the covering layer 21 during the calcination is applied, the process of immersing the laminate in the solution of the component of the above-mentioned covering layer 21 and pulling it up is unnecessary, so that a production cost would be reduced.

In the case where the internal electrode 13 comprises silver-palladium, an electrically conductive paste having a higher silver content in the silver-palladium ratio compared with the electrically conductive paste to form the internal electrode 13 is used as a low-rigidity metal layer 15, thereby a low-rigidity metal layer 15 can be formed without passing through a complicated manufacturing processes.

According to the above method, silver diffuses from the electrically conductive paste having a higher silver content by subjecting the electrically conductive paste having a higher silver content as mentioned above, which was provided on a position where a low-rigidity metal layer 15 is to be formed, to a simultaneous calcination, thereby a stacked body 7 is obtained. A plurality of metal parts 19 isolated from each other are formed due to the diffusion of silver, as a result, the electrically conductive paste having a higher silver content becomes to the low-rigidity metal layer 15 compared with the piezoelectric layer 3 and the internal electrode 13.

At this time, the covering layer 21 can be formed by incorporating a glass for forming the covering layer 21 into the electrically conductive paste to form the low-rigidity metal layer 15. It is because the glass for forming the covering layer 21, which was incorporated into the electrically conductive paste, diffuses together with silver. As already shown, in the case where an electrically conductive paste is used as the low-rigidity metal layer 15, which paste has a higher silver content in the silver-palladium ratio compared with the electrically conductive paste to form the internal electrode 13, silver diffuses from the electrically conductive paste having a higher silver content. The glass to form the covering layer 21 diffuses accompanied by the diffusion of silver.

It is still more preferable that the covering layer 21 contains a lead oxide compound, which has a vapor pressure higher than that of silver. It is because the above-mentioned lead oxide compound evaporates from the metal part 19 in the course of diffusion, and the glass for forming the covering layer 21 deposits at the position which covers the metal part 19 in conjunction with the evaporation of lead oxide compound. Accordingly, the glass containing $PbO-SiO_2$ is preferable as the glass which forms the covering layer 21.

In addition, without being limited to the method as described above, the stacked body can be produced by any method as long as it can produce a stacked body wherein a plurality of piezoelectric layers 3 and a plurality of metal layers 5 are stacked alternately one on another.

Thereafter, the exterior electrode 9 is formed so that the exterior electrode can be electrically connected with the internal electrode 13, which has an end portion exposed on the side surface of the multi-layer piezoelectric element. Such an exterior electrode 9 can be obtained by adding a binder to a glass powder to produce a silver-glass electrically conductive paste, thereafter the paste being printed and burnt.

Next, the stacked body in which the exterior electrode 9 was formed is immersed in a resin solution containing the exterior resin comprising silicone rubber. Then, the silicone resin solution is vacuum degassed, thereby the silicone resin is firmly adhered onto the uneven outer surface of the side surface of the stacked body. Thereafter, the stacked body is pulled up from the silicone resin solution. Thus the side surface of the stacked body is coated with the silicone resin (not shown) by the above process. Then, a lead is connected to the exterior electrode 9 with an electrically conductive adhesive (not shown) and so forth as the current-carrying part 23.

A DC voltage of 0.1 to 3 kV/mm is applied across a pair of external electrodes 15 via the lead wires so as to apply a polarization treatment to the stacked body 13, thereby the multi-layer piezoelectric element is obtained. The lead wires are connected to an external voltage source (not shown) that supplies the voltage via the lead wires as the current-carrying part 23 and the external electrodes 9 to the internal electrode 13, so that each of the piezoelectric layers 3 undergoes significant displacement due to a reverse piezoelectric effect. Thus the device functions as, for example, an automobile fuel ejection valve that injects fuel to an engine.

Figure 8:
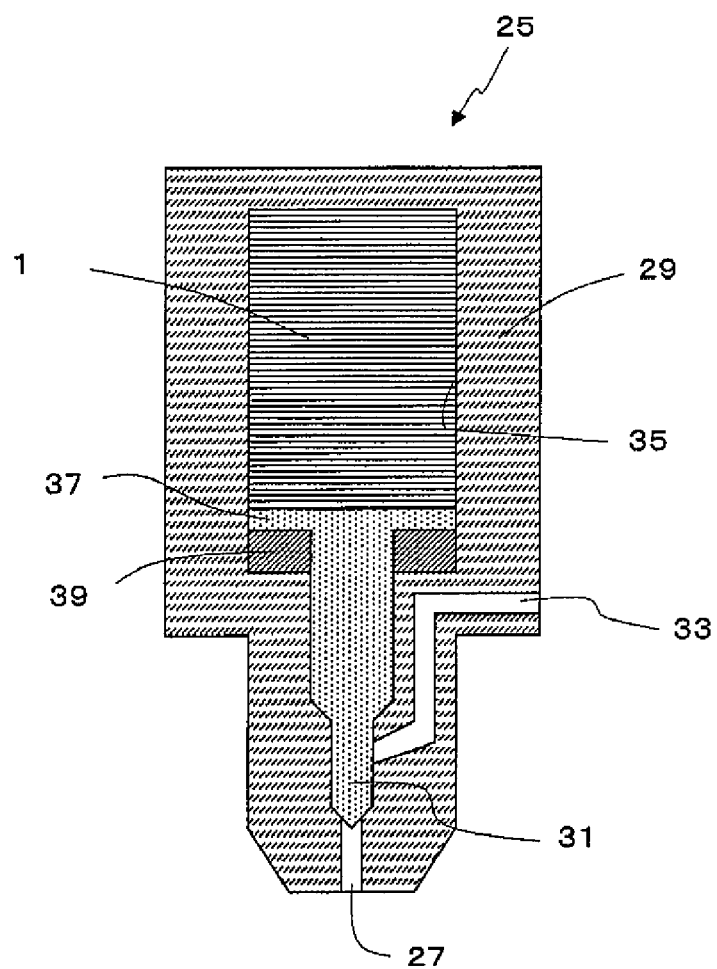
FIG. 8 is a sectional view showing the fuel ejection apparatus of the present invention.

Then, the fuel ejection apparatus of the present invention is described. FIG. 8 is a schematic sectional view showing the ejection apparatus according to an embodiment of the present invention. As shown in FIG. 8, the multi-layer piezoelectric element represented by the above embodiment is accommodated in a storage container which has an ejection hole on an end of the ejection apparatus according to an embodiment of the present invention. A needle valve that can open and close the ejection hole is housed in the container. The ejection hole is connected to a fuel passage disposed so as to be capable of making communication with the movement of the needle valve. The fuel passage is connected to a fuel source that is provided outside of the apparatus, so as to receive supply of the fuel at a high pressure that remains always constant. Therefore, when the needle valve opens the ejection hole, the fuel that fills the fuel passage is injected at a predetermined level of high pressure into a fuel chamber of an internal combustion engine that is not shown in the drawings.

The needle valve has an enlarged top portion of a larger diameter so as to provide a piston that makes a sliding motion in a cylinder that is formed in the container. The piezoelectric element 1 described above is housed in the container.

With the ejection apparatus as described above, when the piezoelectric element is caused to expand by a voltage applied thereto, the piston is pressed so that the needle valve 31 plugs the ejection hole and shuts off the fuel supply. When the voltage is removed, the piezoelectric element contracts and a Belleville spring presses back the piston so that the ejection hole communicates with the fuel passage 33 thereby allowing the fuel to be ejected.

Moreover, the ejection apparatus 25 of the present embodiment may be constituted so that it comprises a container having an ejection hole and the multi-layer piezoelectric element, wherein a liquid filled in the container is ejected through the ejection hole 27 by the operation of the multi-layer piezoelectric element 1. That is, the multi-layer piezoelectric element 1 is not necessarily be located in the container, but is sufficient that the apparatus has a constitution that a pressure may be generated within the container by the drive of the multi-layer piezoelectric element 1. In addition, in the present embodiment, the term liquid includes a fuel, an ink and various fluid in the form of liquid such as a conductive paste.

Figure 9:
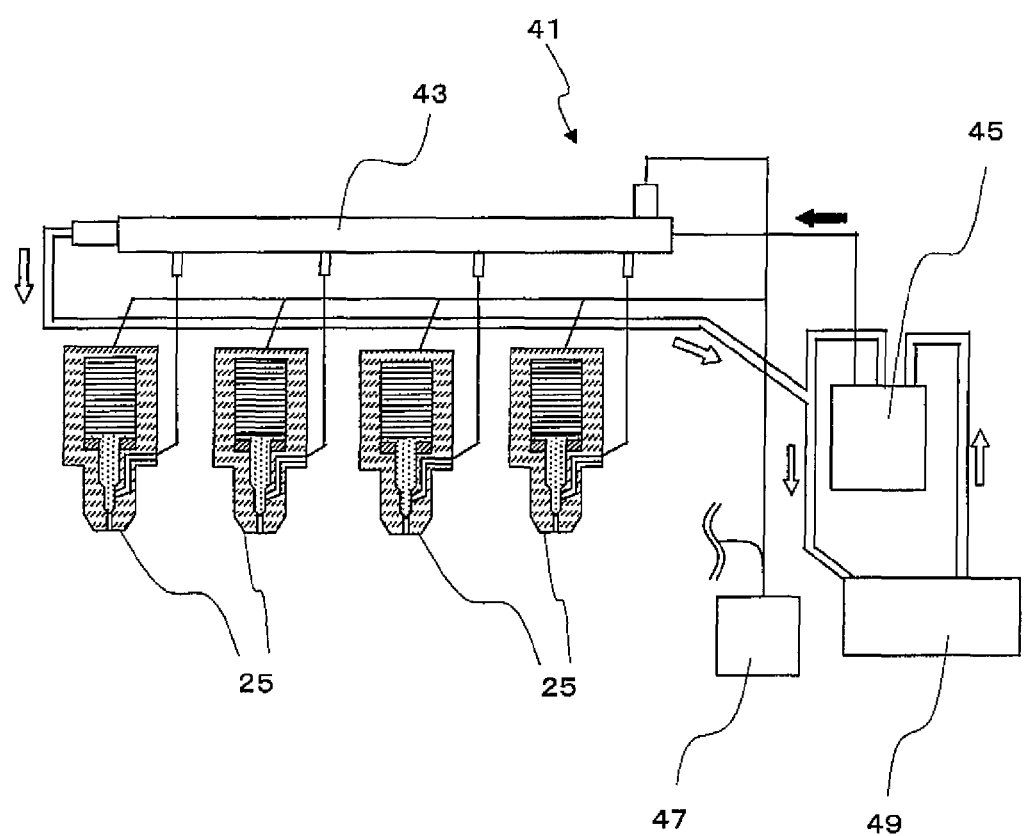
FIG. 9 is a schematic diagram showing the fuel ejection system concerning one embodiment of the present invention.

Then, a fuel ejection system according to an embodiment of the present invention is explained. FIG. 9 is a schematic view showing the fuel ejection system according to an embodiment of the present invention. As shown in FIG. 9, the ejection system of the present invention comprises a common rail that contains a fuel stored at a high pressure, a plurality of ejection apparatus as described in the above which can inject the fuel stored in the common rail, a pump which supplies the fuel to the common rail at a high pressure and an ejection control unit that supplies a drive signal to the ejection apparatus.

The ejection control unit controls the quantity of fuel injected and the timing of ejection, while monitoring the condition in the engine with a sensor. The pump supplies the fuel from the fuel tank to the common rail by boosting the pressure to about 1,000 to 2,000 atm, preferably from 1,500 to 1,700 atm. The common rail stores the fuel sent by the pump and sends it to the ejection apparatus as required. The ejection apparatus injects a small amount of fuel by spraying through the ejection hole.

The present invention relates to a multi-layer piezoelectric element, a fuel ejection apparatus and a fuel ejection system. However, the present invention is not limited to the above-mentioned embodiments, but may be applicable to a driving element to be mounted within a fuel ejection apparatus of an automobile engine, a liquid ejection apparatus of an ink jet printer or the like, a precision positioning device for an optical apparatus, a vibration suppressing device; a sensor element mounted in a combustion pressure sensor, a knocking sensor, an acceleration sensor, a load sensor, an ultrasound sensor, a pressure sensor, a yaw rate sensor or the like, which utilizes the piezoelectric property.

The present invention is not limited to the embodiments described above. Various modifications may be made to the present invention without departing from its scope.

EXAMPLES

Example 1

Multi-layer piezoelectric element 1 of the present invention was fabricated according to the procedure as follows.

First, a raw material powder of lead zirconate titanate (PZT) having an average particle size of 0.4 μm as the main component, a binder and a plasticizer were mixed to form a slurry, which was applied onto a ceramic green sheet to have a thickness of about 150 μm by a doctor blade process.

Then, an electrically conductive paste A, which was obtained by adding a binder to the raw material powder containing a silver-palladium alloy powder having a metal composition of 95% by weight of silver and 5% by weight of palladium was produced.

In addition, an electrically conductive paste B, which is obtained by adding a binder to the raw material powder containing a silver-palladium alloy powder having a metal composition of 98% by weight of silver and 2% by weight of palladium.

In Sample Number 1, the electrically conductive paste A was applied to one side of the above-mentioned ceramic green sheet by screen printing method to a thickness of 30 micrometers. Then the ceramic green sheets were piled on each other so that a stacked body 7 was obtained. In the stacked body 7, 300 pieces of the piled metal layers 5 were used. At each ends of the stacked body 7 in the stacking direction, 20 pieces of the ceramic green sheets, on which the electrically conductive paste was not applied, were piled on, respectively.

In Sample Numbers 2 to 5, the electrically conductive paste A was applied to one side of the above-mentioned ceramic green sheet by screen printing method to a thickness of 30 micrometers. Then, the electrically conductive paste B was applied to one side of the above-mentioned ceramic green sheet by screen printing method to a thickness of 30 micrometers. Each of the ceramic green sheet on which the electrically conductive paste A was printed and the ceramic green sheet on which the electrically conductive paste B was printed was piled on each other to produce each of stacked bodies 7 as follows:

In the stacked body 7 of Sample Number 2, the green sheet on which the electrically conductive paste B was printed is located at each of the 50th and the 250th position of the metal layers 5 in the stacking direction. In the stacked body 7 of Sample Number 3, the green sheet on which the electrically conductive paste B was printed was located at each of the 50th, the 100th, the 150th, the 200th and the 250th position of the metal layers 5 in the stacking direction. In the stacked bodies 7 of Sample Numbers 4 and 5, the green sheet on which the electrically conductive paste B was printed was located at each of the 1st, the 50th, the 100th, the 150th, the 200th, the 250th and the 300th position of the metal layers 5 in the stacking direction. In addition, similar to Sample Number 1, 300 pieces of the metal layers 5 were piled to produce the stacked body 7. At each ends of the stacked body 7 in the stacking direction, 20 pieces of the ceramic green sheets, on which the electrically conductive paste was not applied, were piled on, respectively.

Then, each stacked body 7 of each Sample Number was subjected to a de-binder (i.e. binder removal) treatment, followed by calcined at a temperature from 800° C. to 1200° C. to obtain a calcined body, respectively. In this treatment, in the stacked body 7 of the sample numbers 2 to 5, silver was diffused from the electrically conductive paste B toward the electrically conductive paste A, since the electrically conductive paste A and the electrically conductive paste B used therein contains different concentrations of silver. Thereby, as shown in Table 1, the low-rigidity metal layer 15 having so high rate of void ratio, which was 80%, was produced.

Here, each calcined body of Sample Numbers 2 to 4 was immersed in a solution, which was prepared by adding 1 ppm of dilute sulfuric acid as a gelation rate accelerating agent to an aqueous solution containing 10% of TEOS, and the calcined body, of Sample Number 5 was immersed in an acetone solution containing 5% of an epoxy resin (product name: Araldite). Each sample in a condition accommodated within a container was evacuated to a pressure of at most $2 \times 10^3$ Pa with a rotary pump so as to make each of the low-rigidity metal layers sufficiently absorb the solution. Thereafter, returning to an atmospheric pressure, followed by dried at a temperature of 80° C. for 1 hour.

Then, each of the stacked body 7 was shaped to have a desired size and each exterior electrode 9 was formed thereon. To this end, a binder, a plasticizer, a glass powder and so forth were added to a metal powder, wherein silver is the main component, and mixed to produce an electrically conductive paste for the exterior electrode 9. This electrically conductive paste was applied to the determined portion for forming the exterior electrode 9 on the side surface of the above calcined body by screen printing method. Then the stacked body was calcined at a temperature from 600 to 800° C., thereby the exterior electrode 9 was obtained. The multi-layer piezoelectric element 1 was produced as mentioned above.

As to the multi-layer piezoelectric element 1 of Sample Number 5, the element was immersed in an acetone solution containing 5% of an epoxy resin (product name: Araldite) and then accommodated in a container and evacuated to a pressure of at most $2 \times 10^3$ Pa with a rotary pump so as to make each of the low-rigidity metal layers sufficiently absorb the solution. Thereafter, the pressure was returned to an atmospheric pressure. The surface of the element was washed with acetone to remove the resin component and dried at a temperature of 80° C. for one hour.

Two pieces of each multi-layer piezoelectric elements 1 were produced per each Sample Number. It is intended that one piece is used for the observation by a scanning electron microscope (SEM) and another piece is used for driving performance evaluation. The components of the electrically conductive paste used for producing the multi-layer piezoelectric element 1 of each Sample Number, the void ratio of the metal layer 5 after calcination, and the shape of the low-rigidity metal layer 15 are shown in Table 1.

Here, the void ratio means the rate (%) of the area that the void 17 occupies to the cross-sectional area of the stacked body 7 in the cross section of the stacked body 7 perpendicular to or parallel to the stacked direction thereof. The void ratio was measured as follows.

First, the stacked body 7 was polished by a known polishing means so that a cross section, which is perpendicular to the stacked direction, is exposed. Specifically, the stacked body was polished by, for example, a table polishing machine KEMET-V-300 (available from Kemet Japan Co., Ltd.) as the polishing machine using a diamond paste. The cross section that was exposed by the above polishing treatment was observed, for example, under a scanning electron microscope (SEM), an optical microscope or a metallurgical microscope, and thereby each image of each cross section was obtained. These image of the cross section was subjected to an image processing, so that the void ratio of each sample was determined.

TABLE 1

| Sample No. | internal electrode | | | | low-rigidity metal layer | | | | |
| --- | --- | --- | --- | --- | --- | --- | --- | --- | --- |
| | metal composition in printed paste | | metal composition after calcined | | void ratio (%) | metal composition in printed paste | | metal composition after calcined | | void ratio (%) | form |
| 1 | Ag | 95% | Ag | 95% | 25 | — | | — | | — | — |
| | Pd | 5% | Pd | 5% | | | | | | | |
| 2 | Ag | 95% | Ag | 96% | 15 | Ag | 98% | Ag | 96% | 80 | FIG. 4 |
| | Pd | 5% | Pd | 4% | | Pd | 2% | Pd | 4% | | |
| 3 | Ag | 95% | Ag | 96% | 15 | Ag | 98% | Ag | 96% | 80 | FIG. 4 |
| | Pd | 5% | Pd | 4% | | Pd | 2% | Pd | 4% | | |
| 4 | Ag | 95% | Ag | 96% | 15 | Ag | 98% | Ag | 96% | 80 | FIG. 4 |
| | Pd | 5% | Pd | 4% | | Pd | 2% | Pd | 4% | | |
| 5 | Ag | 95% | Ag | 96% | 15 | Ag | 98% | Ag | 96% | 80 | FIG. 4 |
| | Pd | 5% | Pd | 4% | | Pd | 2% | Pd | 4% | | |

As shown in Table 1, the low-rigidity metal layer 15 was not formed in the multi-layer piezoelectric element 1 of Sample Number 1, since the same component of electrically conductive paste was used therein. On the other hand, the low-rigidity metal layer 15 was formed due to the diffusion of silver in each of the multi-layer piezoelectric element 1 of each of Sample Numbers 2 to 5. Accordingly, the void ratio of the low-rigidity metal layer 15 was 80% compared with the void ratio of the metal layer 5 was 15%. Thus, it is observed that a low-rigidity metal layer 15 having a low rigidity compared with the metal layer 5 and the piezoelectric layer 3 was produced.

As a result of the observation by SEM, in Sample Numbers 2 to 4, as shown in FIG. 4, the covering layer 21 which comprises a glass of $SiO_2$ was formed in a part of the plurality of metal parts 19. It is because a Si oxide in TEOS had deposited on the surface of the metal part 19 as a glass after it was gelled. In a part of the plurality of metal parts 19, a covering layer 21 comprising AgS which was formed by sulfating of Ag was formed besides the covering layer 21 which comprises the glass of above-mentioned $SiO_2$.

In Sample Number 5, as shown in FIG. 4, the covering layer 21 which comprises the epoxy resins was formed in a part of the plurality of metal parts 19.

Then, drive performance was evaluated. As the drive performance, the high speed response property and the durability were evaluated.

First, each lead was connected to each exterior electrode 9, direct current electric field (3 kV/mm) was applied between the exterior electrodes 9 (anode and cathode) via the leads for 15 minutes to perform the polarization treatment. Thus, a piezoelectric actuator using the multi-layer piezoelectric element 1 was produced. Applying a direct current voltage of 170V to the obtained multi-layer piezoelectric element 1, the amount of the displacement at the initial state was measured. As a result, the piezoelectric actuator of Sample Number 1 showed 45 micrometers, and the piezoelectric actuator of Sample Numbers 2 to 4 showed 40 micrometers, respectively. The reason why the amount of the displacement in the piezoelectric actuator of Sample Number 1 is larger than that of the other actuators of Sample Numbers 2 to 4 is that the low-rigidity metal layer 15 did not act as the internal electrode 13 in the multi-layer piezoelectric element 1 in Sample Numbers 2 to 4.

In the evaluation of high speed response property, AC voltage of 0 to +170V was applied to each piezoelectric actuator at the room temperature with gradually increasing the frequency from 150 Hz. In the evaluation of the durability, AC voltage of 0 to +170V was applied to each piezoelectric actuator at the room temperature with the frequency of 150 Hz in one cycle and the cycle was continuously repeated for $1 \times 10^9$ times. The results are shown in Table 2.

TABLE 2

| Sample No. | initial displacement amount (μm) | noise of higher harmonic wave | beat note at frequency over 1 kHz | displacement amount after $1 \times 10^9$ cycles(μm) | peeling at multi-layer after continuous drive ($1 \times 10^9$ cycles) |
|---|---|---|---|---|---|
| 1 | 45 | formed | formed | 5 | found |
| 2 | 40 | not formed | not formed | 38 | not found |
| 3 | 40 | not formed | not formed | 39 | not found |
| 4 | 40 | not formed | not formed | 40 | not found |
| 5 | 40 | not formed | not formed | 40 | not found |

As shown in Table 2, the piezoelectric actuator of Sample Number 1 started to produce a beat note when the frequency exceeded 1 kHz as a result of high speed response property evaluation. The reason why the above phenomenon arose is the multi-layer piezoelectric element 1 of Sample Number 1 was not provided with the low-rigidity metal layer 15, and the constraining force of the internal electrode 13 to the piezoelectric layer 3 was so large. It is considered that the constraining force to the piezoelectric layer 3 was so large, that the multi-layer piezoelectric element 1 failed to follow the applied frequency of the AC voltage.

In addition, in order to check the driving frequency, the pulse shape of the piezoelectric actuator of Sample Number 1 was checked using an oscilloscope DL1640L (available from Yokogawa Electric Corporation). As a result, a higher harmonic wave noise was found at the position which corresponds to the integral multiple of the drive frequency.

As shown in Table 2, as a result of durability evaluation, in the piezoelectric actuator of Sample Number 1, the amount of the displacement after the evaluation test was 5 micrometers, which was decreased by nearly 90% compared with that of before the evaluation test. In the piezoelectric actuator of Sample Number 1, peeling of a part of the multi-layer piezoelectric element was found.

On the other hand, in the piezoelectric actuator of Sample Numbers 2 to 5, no peeling was found. The amount of the displacement after the evaluation test was in a range from 35 to 40 micrometers, thus the amounts of the decreased displacement were remained within 10% or less. In particular, in the piezoelectric actuator of Sample Number 5, it was found that the decreasing amount of the displacement was hardly seen, and it had very high durability.

Example 2

The multi-layer piezoelectric element 1 of the present invention was produced as follows.

The ceramic green sheet was produced in the same process as that of Example 1. Then, an electrically conductive paste C was produced in the way similar to that of the electrically conductive paste A in Example 1. Further, an electrically conductive paste C was produced by adding, as the components for forming the covering layer 21, 0.01% by weight of tetra-ethoxy silane (TEOS) for forming $SiO_2$ based on the silver-palladium alloy powder, and 0.01% by weight of $Pb_3O_4$ based on the silver-palladium alloy powder together with a binder to the raw material powder containing the silver-palladium alloy powder having the metal composition of 98% by weight of silver and 2% by weight of palladium.

In Sample Number 6, on one side of the above-mentioned ceramic green sheet, the electrically conductive paste C was applied so as to have a thickness of 30 micrometers by screen printing method. And each green sheet, on which the electrically conductive paste C was printed, was piled up each other, and the stacked body 7 was produced. In the stacked body 7, 300 pieces of the piled metal layers 5 were used. At each ends of the stacked body 7 in the stacking direction, 20 pieces of the ceramic green sheets, on which the electrically conductive paste was not printed, were piled on, respectively.

In Sample Numbers 7 to 10, on one side of the above-mentioned ceramic green sheet, the electrically conductive paste C was applied so as to have a thickness of 30 micrometers by screen printing method. In addition, on one side of the other above-mentioned ceramic green sheet, the electrically conductive paste D was applied so as to have a thickness of 30 micrometers by screen printing method. In the stacked body 7 of Sample Number 7, the green sheet on which the electrically conductive paste D was printed is located at each of the 50th and the 250th position of the metal layers 5 in the stacking direction. In the stacked body 7 of Sample Number 8, the green sheet on which the electrically conductive paste D was printed is located at each of the 50th, the 100th, the 150th, the 200th and the 250th position of the metal layers 5 in the stacking direction.

In the stacked bodies 7 of Sample Numbers 9 and 10, the stacked body 7 was produced by piling up each of the green sheets, on which the electrically conductive paste C was printed, and the green sheets, on which the electrically conductive paste D was printed each other with considering that the green sheet on which the electrically conductive paste D was printed is located at each of the 1st, the 50th, the 100th, the 150th, the 200th, the 250th and the 300th position of the metal layers 5 in the stacking direction. Similar to Sample Number 6, in the stacked body 7, 300 pieces of the piled metal layers 5 were used. At each ends of the stacked body 7 in the stacking direction, 20 pieces of the ceramic green sheets, on which the electrically conductive paste was not printed, were piled on, respectively.

Then, each stacked body 7 of each Sample Number was subjected to a de-binder (i.e. binder removal) treatment, followed by calcined at a temperature from 800° C. to 1200° C. to obtain a calcined body, respectively. In this treatment, in the stacked body 7 of the sample numbers 7 to 9, silver was diffused from the electrically conductive paste D having higher concentration of silver toward the electrically conductive paste C having lower concentration of silver, since the electrically conductive paste C and the electrically conductive paste D used therein contains different concentrations of silver. Thereby, as shown in Table 3, the low-rigidity metal layer 15 having so high rate of void ratio, which is 80%, was produced.

Then, each of the stacked body 7 was shaped to have a desired size and each exterior electrode 9 was formed thereon. To this end, a binder, a plasticizer, a glass powder and so forth were added to a metal powder, wherein silver is the main component, and mixed to produce an electrically conductive paste for the exterior electrode 9. This electrically conductive paste was applied to the determined portion for forming the exterior electrode 9 on the side surface of the above calcined body by screen printing method and the stacked body was calcined at a temperature from 600 to 800° C., thereby the exterior electrode 9 was obtained. The multi-layer piezoelectric element 1 was produced as mentioned above.

As to the multi-layer piezoelectric element 1 of Sample Number 10, the element was immersed in an acetone solution containing 5% of an epoxy resin (product name: Araldite) and then accommodated in a container and evacuated to a pressure of at most $2 \times 10^3$ Pa with a rotary pump so as to make each of the low-rigidity metal layers sufficiently absorb the solution. Thereafter, the pressure was returned to an atmospheric pressure. The surface of the element was washed with acetone to remove the resin component and dried at a temperature of 80° C. for one hour.

Two pieces of each multi-layer piezoelectric elements 1 were produced per each Sample Number. It is intended that one piece is used for the observation by a scanning electron microscope (SEM) and another piece is used for driving performance evaluation similar to Example 1. The components of the electrically conductive paste used for producing the multi-layer piezoelectric element 1 of each Sample Number, the void ratio of the metal layer 5 after calcination, and the shape of the low-rigidity metal layer 15 are shown in Table 3.

In Example 2, the term void ratio represents the same ratio (%) as Example 1. The same is applicable to the measurement of the void ratio.

As shown in Table 3, the low-rigidity metal layer 15 was not produced in the multi-layer piezoelectric element 1 of Sample Number 6, since the same component of electrically conductive paste was used therein. On the other hand, the low-rigidity metal layer 15 was produced due to the diffusion of silver in each of the multi-layer piezoelectric element 1 of each of Sample Numbers 7 to 9. Accordingly, the void ratio of the low-rigidity metal layer 15 was 80% compared with the void ratio of the metal layer 5 was 15%. Thus, it is observed that a low-rigidity metal layer 15 having a low rigidity compared with the metal layer 5 and the piezoelectric layer 3 was produced.

As a result of the observation by SEM, in Sample Numbers 7 to 9, as shown in FIG. 6, the covering layer 21 which comprises a glass of $SiO_2$—$PbO_2$—$AgO$ was formed in a part of the plurality of metal parts 19 in the low-rigidity metal layer 15. It is because Si oxide and Pb oxide contained in the electrically conductive paste were diffused together with silver and the above glass deposits on the surface of the metal part 19 with evaporation of a part of Pb oxide.

In Sample Number 10, as shown in FIG. 7, a first covering layer 21a substantially comprises a glass of $SiO_2$—$PbO_2$—$AgO$ was produced on at least a part of the plurality of metal parts 19 in the low-rigidity metal layer 15, and a second covering layer 21b substantially comprises an epoxy resin was produced on at least a part of the first covering layer 21a.

Then, drive performance was evaluated. As the drive performance, the high speed response property and the durability were evaluated.

First, each lead was connected to each exterior electrode 9, direct current electric field (3 kV/mm) was applied between the exterior electrodes 9 (anode and cathode) via the leads for 15 minutes to perform the polarization treatment. Thus, a piezoelectric actuator using the multi-layer piezoelectric element 1 was produced. Applying a direct current voltage of 170V to the obtained multi-layer piezoelectric element 1, the amount of the displacement at the initial state was measured. As a result, the piezoelectric actuator of Sample Number 6 showed 45 micrometers, and the piezoelectric actuator of Sample Numbers 7 to 9 showed 40 micrometers, respectively. The reason why the amount of the displacement in the piezoelectric actuator of Sample Number 6 is larger than that of the other actuators of Sample Numbers 7 to 9 is that the low-rigidity metal layer 15 did not act as the internal electrode 13 in the multi-layer piezoelectric element 1 in Sample Numbers 7 to 9.

In the evaluation of high speed response property, AC voltage of 0 to +170V was applied to each piezoelectric actuator at the room temperature with gradually increasing the frequency from 150 Hz. In the evaluation of the durability, AC voltage of 0 to +170V was applied to each piezoelectric actuator at the room temperature with the frequency of 150 Hz in one cycle and the cycle was continuously repeated for $1 \times 10^9$ times. The results are shown in Table 4.

TABLE 3

| | internal electrode | | | low-rigidity metal layer | | | | |
|---|---|---|---|---|---|---|---|---|
| Sample No. | metal composition in printed paste | metal composition after calcined | void ratio (%) | metal composition in printed paste | | metal composition after calcined | | void ratio (%) | form |
| 6 | Ag 95% Pd 5% | Ag 95% Pd 5% | 25 | — | | — | | — | — |
| 7 | Ag 95% Pd 5% | Ag 96% Pd 4% | 15 | Ag 98% Pd 2% | | Ag 96% Pd 4% | | 80 | FIG. 6 |
| 8 | Ag 95% Pd 5% | Ag 96% Pd 4% | 15 | Ag 98% Pd 2% | | Ag 96% Pd 4% | | 80 | FIG. 6 |
| 9 | Ag 95% Pd 5% | Ag 96% Pd 4% | 15 | Ag 98% Pd 2% | | Ag 96% Pd 4% | | 80 | FIG. 6 |
| 10 | Ag 95% Pd 5% | Ag 96% Pd 4% | 15 | Ag 98% Pd 2% | | Ag 96% Pd 4% | | 80 | FIG. 7 |

TABLE 4

| Sample No. | initial displacement amount (μm) | noise of higher harmonic wave | beat note at frequency over 1 kHz | displacement amount after $1 \times 10^9$ cycles (μm) | peeling at multi-layer after continuous drive ($1 \times 10^9$ cycles) |
|---|---|---|---|---|---|
| 6 | 45 | formed | formed | 5 | found |
| 7 | 40 | not formed | not formed | 38 | not found |
| 8 | 40 | not formed | not formed | 39 | not found |
| 9 | 40 | not formed | not formed | 40 | not found |
| 10 | 40 | not formed | not formed | 40 | not found |

As shown in Table 4, the piezoelectric actuator of Sample Number 6 started to produce a beat note when the frequency exceeded 1 kHz as a result of high speed response property evaluation. The reason why the above phenomenon arose may be considered that the multi-layer piezoelectric element 1 of Sample Number 6 was not provided with the low-rigidity metal layer 15, so that it could not follow the applied frequency of the AC voltage.

In order to check the driving frequency, the pulse shape of the piezoelectric actuator of Sample Number 6 was checked using an oscilloscope DL1640L (available from Yokogawa Electric Corporation). As a result, a higher harmonic wave noise was found at the position which corresponds to the integral multiple of the drive frequency.

As shown in Table 4, in the piezoelectric actuator of Sample Number 6, the amount of the displacement after the evaluation test was 5 micrometers, which was decreased by nearly 90% compared with that of before the evaluation test. In the piezoelectric actuator of Sample Number 6, peeling was found at a part of the multi-layer piezoelectric element.

On the other hand, in the piezoelectric actuator of Sample Numbers 7 to 10, no peeling was found. And the amount of the displacement after the evaluation test was in a range from 35 to 40 micrometers, thus the amount of the decreased displacement was remained within 10% or less. In particular, in the piezoelectric actuators of Sample Numbers 9 and 10, it was found that the decreasing amount of the displacement was hardly seen, and it had very high durability.

The invention claimed is:

1. A multi-layer piezoelectric element comprising a stacked body in which a plurality of piezoelectric layers and a plurality of metal layers are stacked alternately one on another,
wherein the plurality of metal layers comprise internal electrodes and a low-rigidity metal layer which has rigidity lower than those of the piezoelectric layer and the internal electrode, and
wherein the low-rigidity metal layer comprises a plurality of metal parts isolated from each other via voids, and a covering layer which covers at least a part of the metal parts.

2. The multi-layer piezoelectric element according to claim 1, wherein a part of the surfaces of the plurality of metal parts is exposed from the covering layer.

3. The multi-layer piezoelectric element according to claim 2, wherein at least one of the metal parts is covered by the plurality of covering layers which are apart from each other.

4. The multi-layer piezoelectric element according to claim 2, wherein at least one of the metal parts has a surface having a plurality of exposed regions which are isolated from each other.

5. The multi-layer piezoelectric element according to claim 1, wherein at least a part of the covering layer is bonded to the piezoelectric layer.

6. The multi-layer piezoelectric element according to claim 1, wherein at least one of the metal parts is bonded to the piezoelectric layer via the covering layer.

7. The multi-layer piezoelectric element according to claim 1, wherein at least one of the metal parts has a surface which is entirely covered by the covering layer.

8. The multi-layer piezoelectric element according to claim 1, wherein the covering layer contains a glass as a main component.

9. The multi-layer piezoelectric element according to claim 1, wherein the covering layer contains a component which is the same as a main component which the metal part contains.

10. The multi-layer piezoelectric element according to claim 9, wherein the covering layer contains an oxide of the component which is the same as the main component of the metal part.

11. The multi-layer piezoelectric element according to claim 1, wherein the covering layer comprises a plurality of layers stacked.

12. The multi-layer piezoelectric element according to claim 11, wherein the plurality of layers in the covering layer have different content of a component from each other, the component being the same as the main component which the metal part contains.

13. The multi-layer piezoelectric element according to claim 11, wherein the covering layer comprises a plurality of layers which have different modulus of elasticity from each other.

14. An ejection apparatus comprising the multi-layer piezoelectric element according to claim 1, and an ejection hole,
wherein liquid is injected through the ejection hole by the drive of the multi-layer piezoelectric element.

15. An ejection system comprising:
a common rail for storing a high-pressure fuel,
an ejection apparatus according to claim 14 for discharging the fuel stored in the common rail; and
an ejection controller that provides a drive signal to the ejection apparatus.

* * * * *